(12) United States Patent
Bahl

(10) Patent No.: US 10,278,301 B2
(45) Date of Patent: Apr. 30, 2019

(54) RETROFIT MULTI-GANG ELECTRICAL BOX

(71) Applicant: Michael Vernon Bahl, Hilliard, FL (US)

(72) Inventor: Michael Vernon Bahl, Hilliard, FL (US)

(*) Notice: Subject to any disclaimer, the term of this patent is extended or adjusted under 35 U.S.C. 154(b) by 0 days.

(21) Appl. No.: 15/951,879

(22) Filed: Apr. 12, 2018

(65) Prior Publication Data
US 2018/0235095 A1    Aug. 16, 2018

(51) Int. Cl.
*H02G 3/08* (2006.01)
*H05K 5/02* (2006.01)
*H05K 5/03* (2006.01)
*H02G 3/10* (2006.01)
*H02G 3/12* (2006.01)

(52) U.S. Cl.
CPC .......... *H05K 5/0247* (2013.01); *H02G 3/081* (2013.01); *H02G 3/086* (2013.01); *H02G 3/10* (2013.01); *H02G 3/123* (2013.01); *H05K 5/0217* (2013.01); *H05K 5/03* (2013.01)

(58) Field of Classification Search
CPC .......... H02G 3/08; H02G 3/081; H02G 3/085; H02G 3/12; H02G 3/121; H02G 3/123; H02G 3/086; H02G 3/10; H05K 5/00; H05K 5/02; H05K 5/0247; H05K 5/0217; H05K 5/03; H01R 13/46
USPC ....................... 174/50, 53, 57, 58, 480, 481; 220/3.2-3.9, 4.02; 361/600, 601, 679.01
See application file for complete search history.

(56) References Cited

U.S. PATENT DOCUMENTS

| | | | | |
|---|---|---|---|---|
| 6,395,981 B1* | 5/2002 | Ford | ............... | H02G 3/086 174/499 |
| 6,642,447 B1* | 11/2003 | Mailloux | ............... | H02G 3/081 174/480 |
| 7,075,004 B1* | 7/2006 | Gretz | ............... | H02G 3/085 174/50 |
| 8,193,444 B2* | 6/2012 | Rodenberg | ............ | H02G 3/126 174/50 |
| 8,212,144 B1* | 7/2012 | Gretz | ............... | H02G 3/086 174/480 |
| 8,446,737 B1* | 5/2013 | Tschirpke | ............. | H04R 1/025 361/752 |
| 9,035,175 B2* | 5/2015 | Korcz | .................. | H02G 3/086 174/50 |

* cited by examiner

*Primary Examiner* — Angel R Estrada
(74) *Attorney, Agent, or Firm* — Ashkan Najafi

(57) ABSTRACT

A retrofit multi-gang electrical box for receiving plurality of electrical devices and wirings is disclosed. The electrical box comprising an electrical enclosure defining a side walls, a lower wall, an upper wall and a rear wall, the rear wall having a perimeter adjoining the side walls, the lower wall and the upper wall forming a L-shaped cavity. A plurality of channels disposed at the rear box wall for receiving electrical wires. A complementary cover assembly configured to removably affix to an opening of the cavity of the electrical enclosure. A plurality of top engaging formation and bottom engaging formations arranged in a facing mirror image relationship relative to one another for receiving an electrical outlet member. The cover assembly comprises plurality of engaging protrusions for affixing the cover assembly to the front opening of the electrical enclosure.

7 Claims, 6 Drawing Sheets

RETROFIT MULTI-GANG ELECTRICAL BOX

BACKGROUND OF THE INVENTION

A. Technical Field

The present invention generally relates to a housing to receive electrical devices and wires. Specifically, the present invention relates to a retrofit multi-gang electrical box for receiving plurality of electrical devices and wirings.

B. Description of Related Art

Electrical enclosures, frames, housings, boxes or the like are quite common and are extensively used to support fixtures to which high and low voltage wires are terminated, to prevent electrical shocks to equipment users and to prevent fixtures from the environment. Examples of such fixtures are switches, duplex receptacles, Ground Fault Circuit Interrupters, telephone jacks, cable connections, switches, knobs, displays and other power or communication devices. Such enclosures supporting these fixtures requires support within the building structure if they are to be installed in accordance with local or national industry codes.

Electrical outlets are installed by cutting a hole in the drywall at a size of the box to be installed on the wall. After cutting the hole in the drywall, the electrical box is positioned inside the hole and wirings of the electrical device is accomplished. Most houses and condos are built with standard size electrical boxes. Today with the ever-increasing demand for all new innovative devices desired with remodels and upgrades to existing homes, electrical housings need more accommodated space. For example, the modern decora light dimming switch or decora duplex receptacle or decora duplex receptacle with USB charging capabilities uses twice the space in an electrical box as its former counterpart. Trying to install new or more wires into an already existing electrical box, always result in improper fit of device or congested wire arrangement or even sometimes leads to breakage of components installed in the electrical box, given the desperate lack of space.

Accordingly, there exists a need for an improved retrofit multi-gang electrical box for receiving plurality of electrical devices and wirings. Further, there is need for a retrofit multi-gang electrical box that provides more space to manipulate wires and install at least 50 percent more wires than conventional electrical box.

SUMMARY OF THE INVENTION

The present invention discloses a retrofit multi-gang electrical box for receiving plurality of electrical devices and wirings.

The electrical box comprising an electrical enclosure including a first side wall, second side wall, a lower wall, an upper wall and a rear wall defining a L-shaped cavity having an L-shaped opening. The rear wall having a perimeter adjoining the side walls, the lower wall and the upper wall. A plurality of channels disposed at the rear wall side for receiving electrical wires. A plurality of top engaging formation and bottom engaging formations arranged in a facing mirror image relationship relative to one another for receiving an electrical outlet member such as electrical device, such as a light switch, a Ground Fault Circuit Interrupter (GFCI), a duplex outlet, or any other suitable electrical device. The bottom engaging formations comprises protrusions which, extend from the cavity opening to an inner surface of the cavity. Protrusions may include through hole that extends towards the cavity opening from an inner surface of the cavity.

A complementary cover assembly configured to removably affix to an opening of the cavity of the electrical enclosure. The cover assembly comprises plurality of engaging protrusions configured to engage with the front opening of the electrical enclosure and the through holes of the bottom engaging formation to affix the cover assembly to the electrical enclosure. In one embodiment, the electrical enclosure is a single gang electrical box. In another embodiment, the electrical enclosure is a multiple gang electrical box.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF DRAWINGS

The embodiments herein will be better understood from the following detailed description with reference to the drawings, in which.

DETAILED DESCRIPTION OF EMBODIMENTS

A description of embodiments of the present invention will now be given with reference to the Figures. It is expected that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

Figure 1:
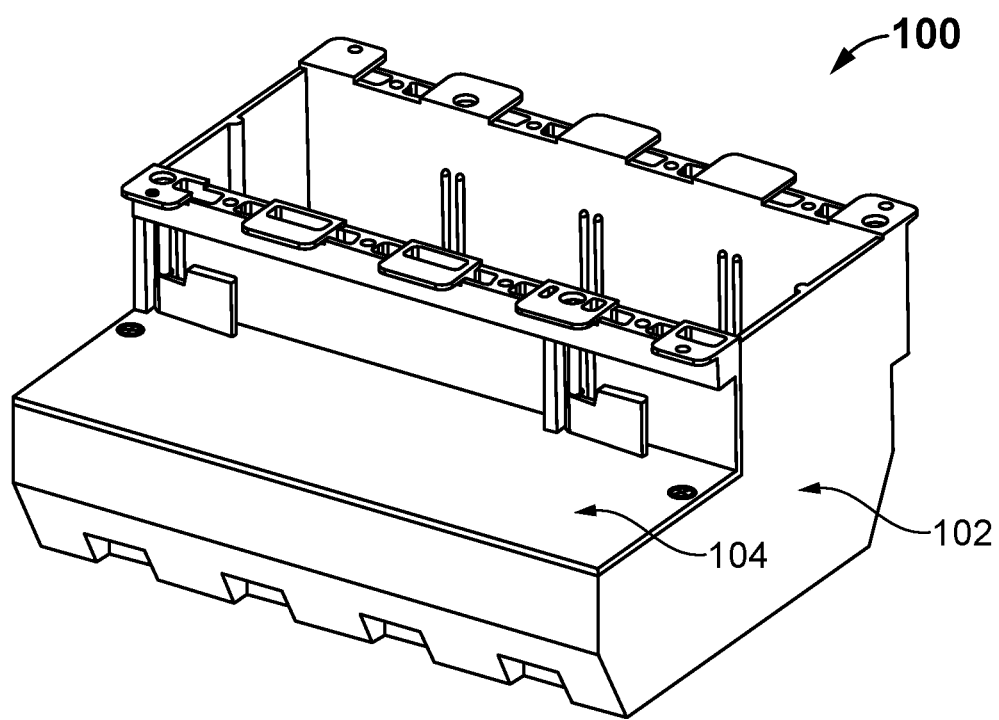
FIG. 1 is a perspective view of the electrical box in an embodiment of the present invention.
Figure 2:
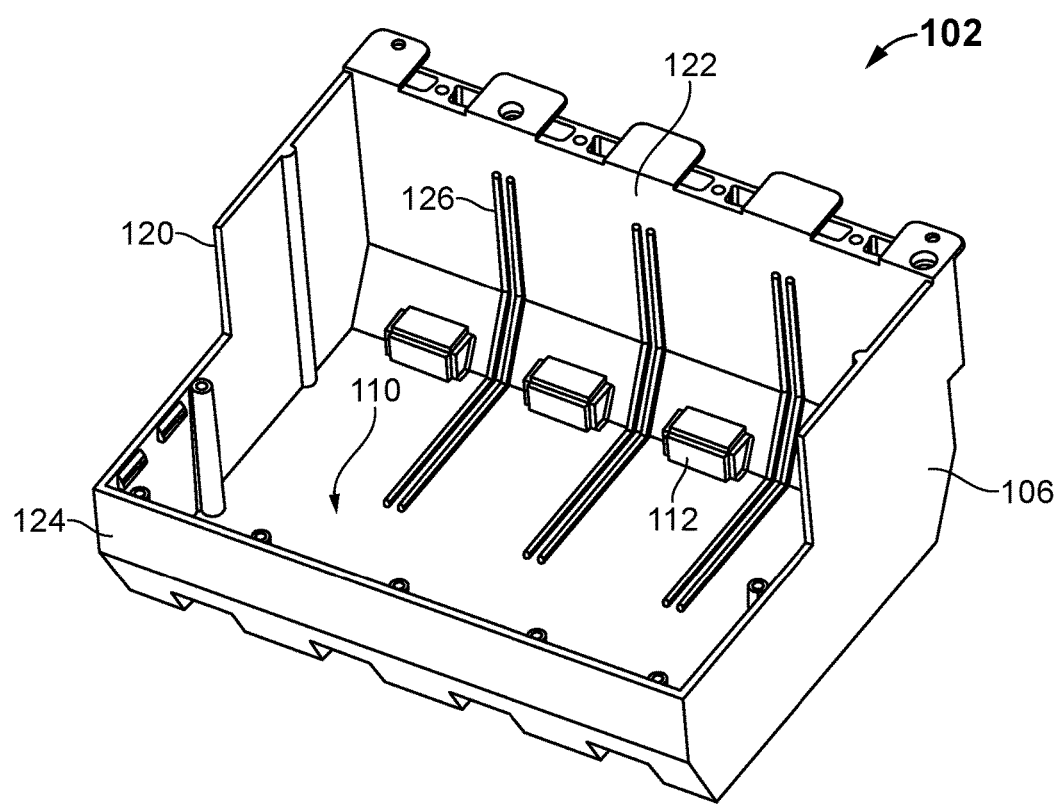
FIG. 2 is a front perspective view of the electrical enclosure in an embodiment of the present invention.
Figure 3:
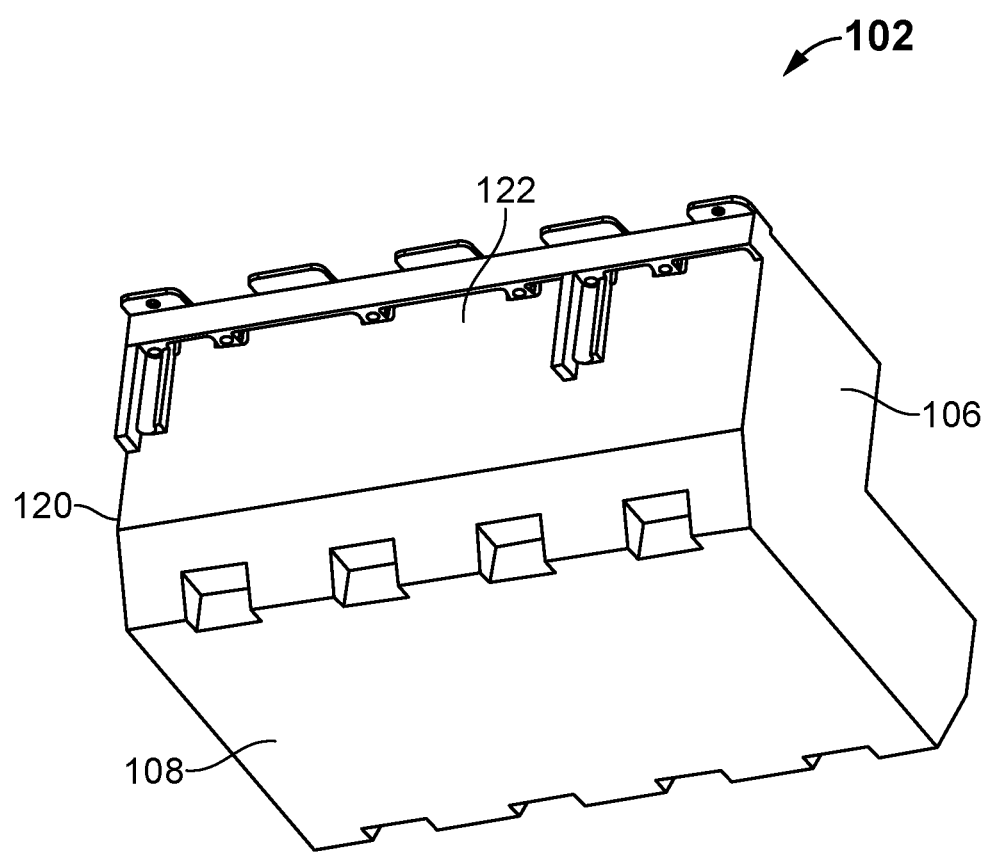
FIG. 3 is a rear perspective view of the electrical enclosure in an embodiment of the present invention.

Referring to FIG. 1-FIG. 3, the present provides a retrofit multi-gang electrical box 100 for receiving plurality of electrical devices and wirings. The electrical box 100 includes an electrical enclosure 102 and a cover assembly 104. The electrical enclosure 102 includes a first side wall 106, second side wall 120, a lower wall 124, an upper wall 122 and a rear wall 108 defining a L-shaped cavity 110 having an L-shaped opening extending to a front surface of the electrical box 100. Referring to FIG. 2, a front perspective view of the electrical enclosure 102 is disclosed in an embodiment of the present invention. In one embodiment, the electrical enclosure 102 is an L-shaped electrical enclosure 102. A plurality of channels 112 is disposed inside the cavity 110 at the rear wall side 108 for receiving electrical wires. FIG. 3 is a rear perspective view of the electrical enclosure 102 illustrating the rear wall 108 and the upper wall 122 of the electrical enclosure 102.

Figure 4:
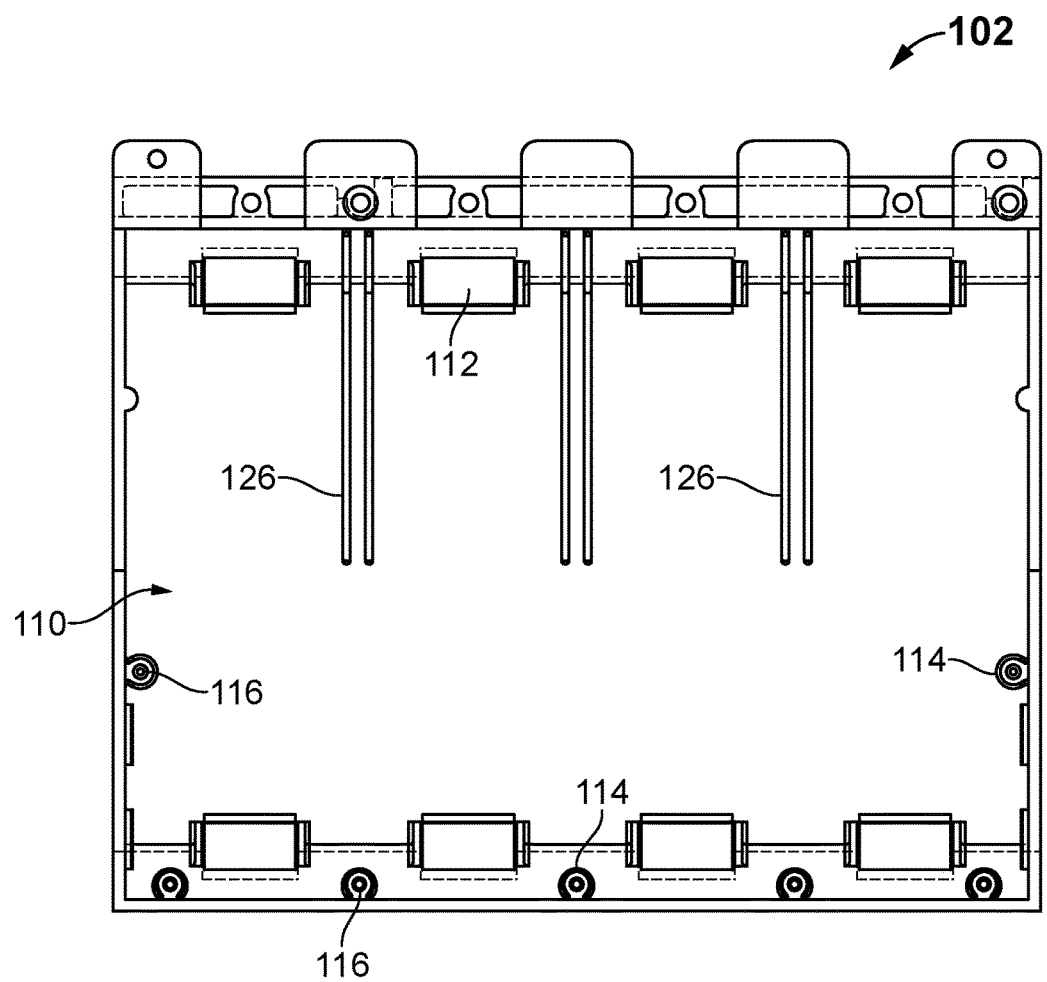
FIG. 4 is a top view of the electrical enclosure of the electrical box in an embodiment of the present invention.

Referring to FIG. 2 and FIG. 4, in accordance with one embodiment, a plurality of top engaging formation 126 and bottom engaging formations arranged in a facing mirror image relationship relative to one another for receiving an electrical outlet member such as a light switch, a Ground Fault Circuit Interrupter (GFCI), a duplex outlet, or any other suitable electrical device. The bottom engaging formations comprises protrusions 114 which, extend from the cavity opening to an inner surface of the cavity 110. Protrusions 114 may include through hole 116 that extends towards the cavity opening from an inner surface of the cavity 110. protrusions 114 also include a proximate portion and a distal portion. Proximate portion is preferably located adjacent to lower wall 124, first side wall 106 and second side wall 120, respectively. Distal portion may extend further inward from proximate portion and terminates at an end which defines the innermost position of each protrusion 114. The protrusions 114 also have a sidewall defining a portion of an outer surface of the protrusion.

Figure 5:
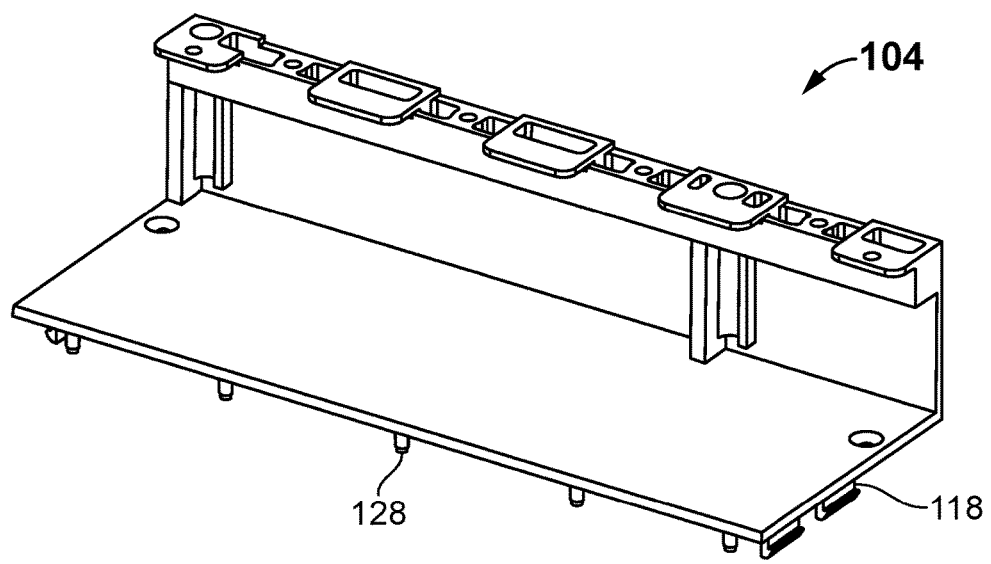
FIG. 5 is a front perspective view of a cover assembly of the electrical box in an embodiment of the present invention.
Figure 6:
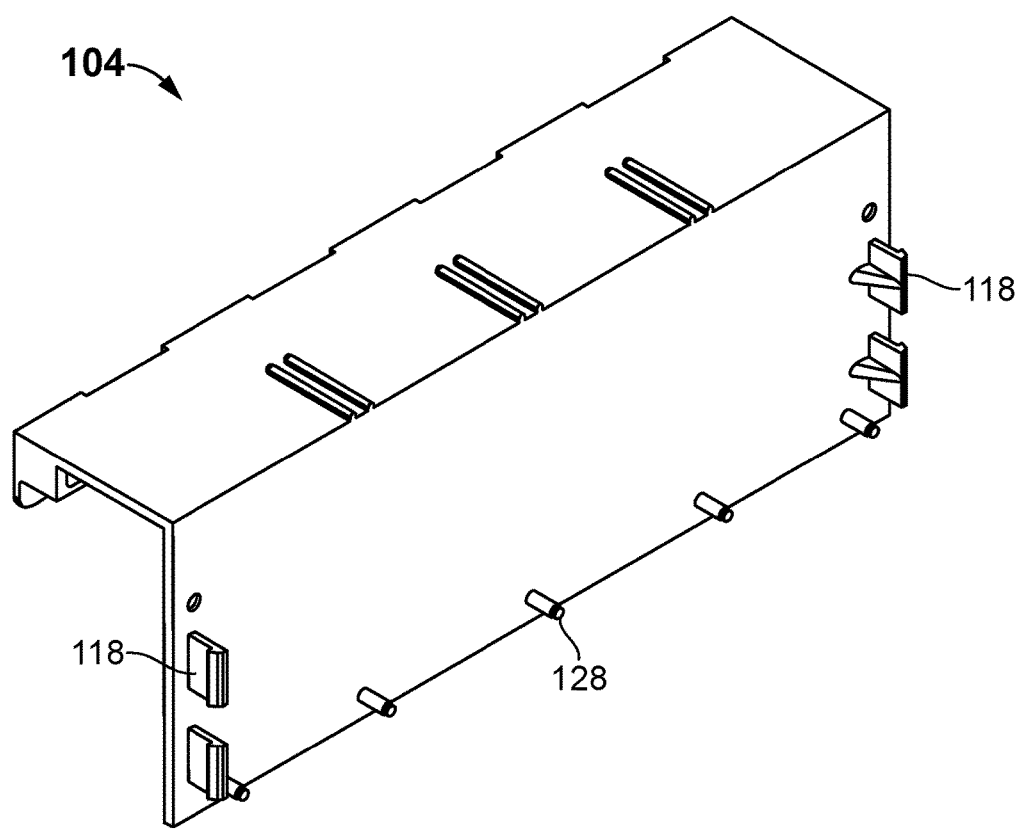
FIG. 6 is a rear perspective view of a cover assembly of the electrical box in an embodiment of the present invention.

Still, referring to FIG. 4, multi-gang electrical box 100 comprises at least eight protrusions 114 extending inward from bottom wall 124, first side wall 106 and second side wall 120. Specifically, at least six protrusions 114 extends upward from an inner surface of bottom wall 124. Additionally, at least one protrusion 114 extends from the first side wall 106 and the second side wall 120. Referring to FIG. 5 a front perspective view of a complementary cover assembly 104 of the electrical box 100 is disclosed in an embodiment of the present invention. The complementary cover assembly 104 is configured to affix to the L-shaped opening of the electrical enclosure 102. Referring to FIG. 6, a plurality of engaging protrusion 128, 118 is disposed in the cover assembly 104, which facilitates for fixing the complementary L-shaped cover assembly 104 to the L-shaped opening of the electrical enclosure 102 and the through holes 116 of the bottom engaging formation. In one embodiment, the electrical box 100 allows to reuse existing plates/covers and 6/32 screws for closing the electrical enclosure 102. In one embodiment, the electrical box 100 is a double gang electrical box with a space of 22 cubic square inches. In another embodiment, the electrical box 100 is a triple gang electrical box with a space of 52 cubic square inches. In yet another embodiment, the electrical box 100 is a four-gang electrical box with a space of 68 cubic square inches. In yet another embodiment, the electrical box 100 is a multi-gang electrical box.

In an embodiment, the method of installation of electrical box 100 without forming a new hole in the plaster/wall or placing over the old or existing box is disclosed. The existing electrical box comprising electrical circuits are deenergized. The cover plate of the existing electrical box is removed to remove the existing switches or plugs for unmounting the existing electrical box from the wall. A strategy is need to be determined for placement of wire into the retrofit multi-gang electrical box 100 and the wires are inserted through the channel 112 provided at the rear wall side of the electrical box 100. The L-shaped cavity 110 of the electrical box 100 is partially inserted into the hole of the wall. With the cavity 110 of the box 100 partially in the wall, the adjacent wires are fed via the rear wall side of the retrofit electrical box 100. Then the electrical box 100 is completely placed inserted into the hole of the wall by pushing or rotation the electrical box 100, until the box 100 snugly fits in the hole of the wall. on securing the box 100 to the wall, the electrical devices such as switches, plugs are reinstalled and closed with the cover assembly 104.

Advantageously, the present invention provides an improved retrofit multi-gang electrical box 100 for receiving plurality of electrical devices and wirings. according to the present invention, the retrofit multi-gang electrical box 100 that provides more space to manipulate wires and install at 50 percent more wires than conventional electrical box. The more space and cubic inches of the electrical box 100 allows approximately 50% more wire to be placed and enables the wire to lay flat in the interior and on the exterior part of the box 100. This gives space to bend wire and the ability to manipulate the wires to keep the devices square, clean, and flush with the plate. According to the electrical box 100 of the present invention, includes further advantages such as reduces installation time, avoids replacement of plaster and cleaning up, uses existing cover plate and allows installation with standard toolset.

Although a single embodiment of the invention has been illustrated in the accompanying drawings and described in the above detailed description, it will be understood that the invention is not limited to the embodiment developed herein, but is capable of numerous rearrangements, modifications, substitutions of parts and elements without departing from the spirit and scope of the invention.

The foregoing description comprises illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings presented in the foregoing descriptions. Although specific terms may be employed herein, they are used only in generic and descriptive sense and not for purposes of limitation. Accordingly, the present invention is not limited to the specific embodiments illustrated herein.

What is claimed is:

1. An electrical box, comprising:
   an electrical enclosure defining a side walls, a lower wall, an upper wall and a rear wall, the rear wall having a perimeter adjoining the side walls, the lower wall and the upper wall to form a cavity;
   a complementary cover assembly configured to removably affix to approximately a lower half of a front opening of the cavity of the electrical enclosure such that an upper half of said front opening is open for receiving a plurality of existing electrical outlet members;
   a plurality of top engaging formations and bottom engaging formations arranged in a facing mirror image relationship relative to one another for receiving the plurality of existing electrical outlet members; and
   a plurality of channels disposed at the rear box wall for receiving electrical wires, said channels being aligned in parallel along a linear horizontal travel path within said cavity, said channels being intermediately juxtaposed between adjacent ones of said top engaging formations and bottom engaging formations, respectively;

wherein the cavity of the electrical enclosure is of L-shape;

wherein the complementary cover assembly is of L-shape.

2. The electrical box of claim 1, wherein the plurality of bottom engaging formations comprises a protrusion extending from the lower half of the front opening of the cavity to an inner surface of the cavity.

3. The electrical box of claim 1, wherein the protrusion further comprises through hole.

4. The electrical box of claim 3, wherein the complementary cover assembly comprises plurality of engaging protrusions to engage with the through hole and the front opening of the electrical enclosure for affixing the cover assembly.

5. The electrical box of claim 1 is a single gang electrical box.

6. The electrical box of claim 1 is a multiple gang electrical box.

7. An electrical box, comprising:

an electrical enclosure defining a side walls, a lower wall an upper wall and a rear wall the rear wall having a perimeter adjoining the side walls, the lower wall and the upper wall to form a cavity;

a complementary cover assembly configured to removably affix to approximately a lower half of a front opening of the cavity of the electrical enclosure such that an upper half of said front opening is open for receiving a plurality of existing electrical outlet members;

a plurality of top engaging formations and bottom engaging formations arranged in a facing mirror image relationship relative to one another for receiving the plurality of existing electrical outlet members; and a plurality of channels disposed at the rear box wall for receiving electrical wires, said channels being aligned in parallel along a linear horizontal travel path within said cavity, said channels being intermediately juxtaposed between adjacent ones of said top engaging formations and bottom engaging formations, respectively;

wherein the cavity of the electrical enclosure is of L-shape;

wherein the complementary cover assembly is of L-shape;

wherein said complementary cover assembly includes selected ones of said top engaging formations statically attached to an upper interior side of said complementary cover assembly.

* * * * *